United States Patent
Wu

(12) 
(10) Patent No.: US 6,765,258 B1
(45) Date of Patent: Jul. 20, 2004

(54) STACK-GATE FLASH MEMORY CELL STRUCTURE AND ITS CONTACTLESS FLASH MEMORY ARRAYS

(75) Inventor: Ching-Yuan Wu, Hsinchu (TW)

(73) Assignee: Intelligent Sources Development Corp., Hsinchu (TW)

( * ) Notice: Subject to any disclaimer, the term of this patent is extended or adjusted under 35 U.S.C. 154(b) by 162 days.

(21) Appl. No.: 10/207,801

(22) Filed: Jul. 31, 2002

(51) Int. Cl.[7] .............................................. H01L 29/788
(52) U.S. Cl. ....................................................... 257/315
(58) Field of Search .......................................... 257/315

(56) References Cited

U.S. PATENT DOCUMENTS

| | | | | |
|---|---|---|---|---|
| 4,295,265 A | * | 10/1981 | Horiuchi et al. | ............ 438/257 |
| 6,462,375 B1 | * | 10/2002 | Wu | ............................. 257/316 |
| 6,537,880 B1 | * | 3/2003 | Tseng | .......................... 438/260 |

* cited by examiner

Primary Examiner—David Nelms
Assistant Examiner—Tu-Tu Ho
(74) Attorney, Agent, or Firm—Pro-Techtor International Services

(57) ABSTRACT

The stack-gate flash memory cell structure of the present invention comprises a floating-gate structure with a thinner floating-gate layer being formed in a central portion by using a spacer-formation technique; an implanted region being formed in the central portion of a channel for adjusting threshold-voltage and forming a punch-through stop; and a highly conductive control-gate structure spaced with an intergate-dielectric layer being formed over the floating-gate structure. The contactless NOR-type array of the present invention comprises a plurality of common-source conductive bus lines and a plurality of planarized common-drain conductive islands being integrated with a plurality of metal bit-lines. The contactless parallel common-source/drain bit-line array comprises a plurality of common-source/drain conductive bit-lines and a plurality of metal word-lines being integrated with a plurality of planarized control-gate conductive islands.

20 Claims, 10 Drawing Sheets

STACK-GATE FLASH MEMORY CELL STRUCTURE AND ITS CONTACTLESS FLASH MEMORY ARRAYS

BACKGROUND OF THE INVENTION

1. Field of the Invention

The present invention relates generally to a non-volatile semiconductor memory device and its semiconductor memory arrays and, more particularly, to a stack-gate flash memory cell structure and its contactless flash memory arrays.

2. Description of Related Art

The stack-gate flash memory cell is known to be a one-transistor cell, in which the gate length of a cell can be defined by using a minimum-feature-size (F) of technology used. Therefore, the stack-gate flash memory cell is often used in existing high-density memory system.

FIG. 1A shows a typical schematic structure of a stack-gate flash memory cell, in which a gate-stack including a control-gate layer (CG) 104a, an intergate-dielectric layer 103a, a floating-gate layer (FG) 102a, and a tunneling-dielectric layer 101a is patterned and formed on a semiconductor substrate 100; a double-diffused source structure including a shallow heavily-doped source diffusion region 106a being formed within a deeper lightly-doped source diffusion region 105a is formed in the source side of the gate-stack; and a shallow heavily-doped drain diffusion region 106a is formed in the drain side of the gate-stack. The double-diffused source structure is mainly used to eliminate the band-to-band tunneling effect during the erasing operation and may offer a larger overlapping area for the source-side erase. The shallow heavily-doped drain diffusion region 106a is mainly used to tailor a drain electric field for hot-electron generation during the programming operation. The asymmetric source/drain diffusion structure shown in FIG. 1A can be used to implement a NOR-type flash memory array.

FIG. 1B shows another typical schematic structure of a stack-gate flash memory cell, in which a gate-stack is also patterned and formed in a semiconductor substrate 100, and a symmetrical source/drain diffusion structure having a heavily-doped source/drain diffusion region 105a/105b is formed in both sides of the gate-stack. The symmetrical source/drain diffusion structure is mainly used to implement a NAND-type flash memory array.

It is clearly seen from FIG. 1A and FIG. 1B that as the gate length of the gate-stack is scaled, the punch-through voltage of a stack-gate flash memory cell which is proportional to the square of the gate length is reduced drastically. The reduction of the punch-through voltage becomes a major concern for FIG. 1A because a moderately high drain voltage is in general needed for programming using hot-electron injection. Similarly, the junction depth of the source/drain diffusion regions must also be scaled accordingly, the erasing area using either the source-side erase or the substrate erase becomes smaller and the erasing speed becomes slower. Moreover, the read speed of a NAND-type array will be drastically reduced due to a higher parasitic source/drain series resistance of a shallow common source/drain diffusion region.

It is, therefore, a major objective of the present invention to offer an efficient punch-through stop structure for a stack-gate flash memory cell.

It is another objective of the present invention to offer a highly conductive bus line or island for shallow source/drain diffusion regions to improve the contact resistance and the contact integrity of a flash memory array.

It is further objective of the present invention to offer a contactless structure for different flash memory arrays.

SUMMARY OF THE INVENTION

A stack-gate flash memory cell structure and its contactless flash memory arrays are disclosed by the present invention. The stack-gate flash memory cell structure of the present invention comprises a source diffusion region and a drain diffusion region being separately or simultaneously formed in each side portion of a gate-stack region; a floating-gate structure with a thinner floating-gate layer being formed in a central portion by using a pair of second sidewall dielectric spacers being formed over inner sidewalls of a gate-stack; an implanted region comprising a shallow implant region for threshold-voltage adjustment and a deeper implant region for forming a punch-through stop being formed in a central portion of a channel between the pair of second sidewall dielectric spacers; a highly conductive control-gate structure spaced with an intergate-dielectric layer being formed over the floating-gate structure. The stack-gate flash memory cell structure of the present invention is used to implement two different types of contactless flash memory array: a contactless NOR-type flash memory array and a contactless parallel common-source/drain bit-line flash memory array.

The contactless NOR-type flash memory array of the present invention comprises a plurality of gate-stacks being formed over a shallow-trench-isolation (STI) structure having a plurality of parallel shallow-trench-isolation regions and a plurality of active regions formed alternately in a semiconductor substrate of a first conductive type, wherein each of the plurality of gate-stacks comprises: a plurality of floating-gate structures being alternately formed in the plurality of active regions with an elongated control-gate conductive layer spaced by an intergate-dielectric layer being formed over the plurality of floating-gate structures and a plurality of first raised field-oxide layers to act as a word line, a plurality of implanted regions of said first conductivity type being formed in central portions of the plurality of active regions for threshold-voltage adjustment and forming punch-through stops; a plurality of common-source conductive bus lines being formed over a plurality of first flat beds between first sidewall dielectric spacers with each of the plurality of first flat beds being alternately formed by a common-source diffusion region of a second conductivity type and a third raised field-oxide layer; a plurality of planarized common-drain conductive islands being formed on a plurality of common-drain diffusion regions of the second conductivity type between another first sidewall dielectric spacers formed over a portion of a plurality of second flat beds with each of the plurality of second flat beds being alternately formed a common-drain diffusion region of the second conductivity type and a third raised field-oxide layer; and a plurality of metal bit-lines integrated with the plurality of planarized common-drain conductive islands being formed transversely to the plurality of gate-stacks.

The contactless parallel common-source/drain bit-line flash memory array of the present invention comprises a plurality of gate-stacks being formed over a shallow-trench-isolation structure having a plurality of parallel STI regions and a plurality of active regions formed alternately on a semiconductor substrate of a first conductivity type, wherein each of the plurality of gate-stacks comprises: a plurality of floating-gate structures being alternately formed in the plurality of active regions with a plurality of planarized control-gate conductive islands spaced by an intergate-dielectric layer being formed over the plurality of floating-gate structures, a plurality of implanted regions of the first conductivity type being formed in central portions of the plurality of active regions for threshold-voltage adjustment and forming punch-through stops; a plurality of common-source/drain conductive bit-lines being formed over a plurality of first/second flat beds between first sidewall dielectric spacers with each of the plurality of first/second flat beds being alternately formed by a common-source/drain diffusion region of a second conductivity type and a third raised field-oxide layer; and a plurality of metal word-lines integrated with the plurality of planarized control-gate conductive islands being formed transversely to the plurality of common-source/drain conductive bit-lines.

BRIEF DESCRIPTION OF THE DRAWINGS

FIG. 1A and FIG. 1B show schematic cross-sectional views for stack-gate flash memory cells of the prior art, in which FIG. 1A shows a schematic cross-sectional view of a stack-gate flash memory cell with an asymmetric source/drain diffusion structure and FIG. 1B shows a schematic cross-sectional view of a stack-gate flash memory cell with a symmetrical source/drain diffusion structure.

DETAILED DESCRIPTION OF THE PREFERRED EMBODIMENTS

Figure 2A:
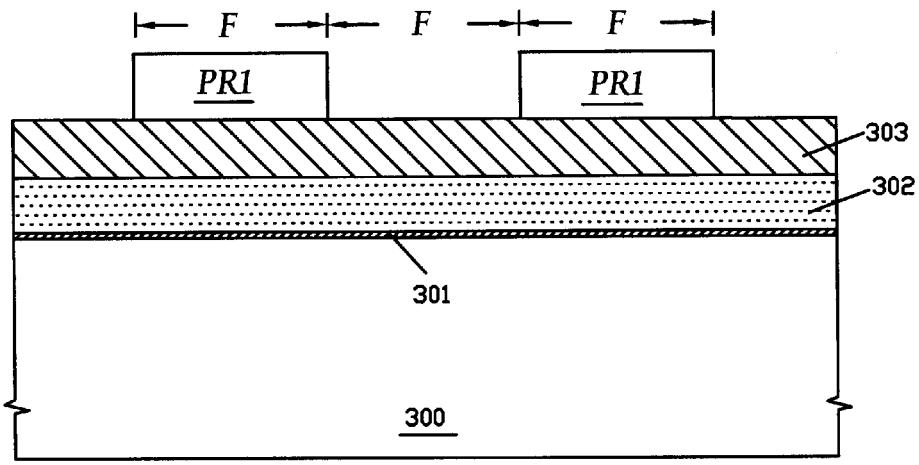
FIG. 2A through FIG. 2F show the process steps and their cross-sectional views of fabricating a shallow-trench-isolation (STI) structure for a stack-gate flash memory cell structure and its contactless flash memory arrays of the present invention.

Referring now to FIG. 2A through FIG. 2F, there are shown the process steps and their cross-sectional views of fabricating a shallow-trench-isolation (STI) structure for a stack-gate flash memory cell structure and its contactless flash memory arrays of the present invention. FIG. 2A shows that a tunneling-dielectric layer 301 is formed on a semiconductor substrate 300 of a first conductivity type, a first conductive layer 302 is then formed on the tunneling-dielectric layer 301, and a first masking dielectric layer 303 is subsequently formed over the first conductive layer 302. Thereafter, a plurality of masking photoresist PR1 are formed on the first masking dielectric layer 303 to define a plurality of active regions (under PR1) and a plurality of parallel STI regions (between PR1). The width and the space of the plurality of masking photoresist PR1 can be defined to be a minimum-feature-size (F) of technology used. The tunneling-dielectric layer 301 is preferably a thermal-oxide layer or a nitrided thermal-oxide layer and its thickness is preferably between 80 Angstroms and 120 Angstroms. The first conductive layer 302 is preferably a doped polycrystalline-silicon or doped amorphous-silicon layer as deposited by low-pressure chemical-vapor-deposition (LPCVD) and its thickness is preferably between 1000 Angstroms and 3000 Angstroms. The first masking dielectric layer 303 is preferably made of silicon-nitride as deposited by LPCVD and its thickness is preferably between 500 Angstroms and 2000 Angstroms.

Figure 2B:
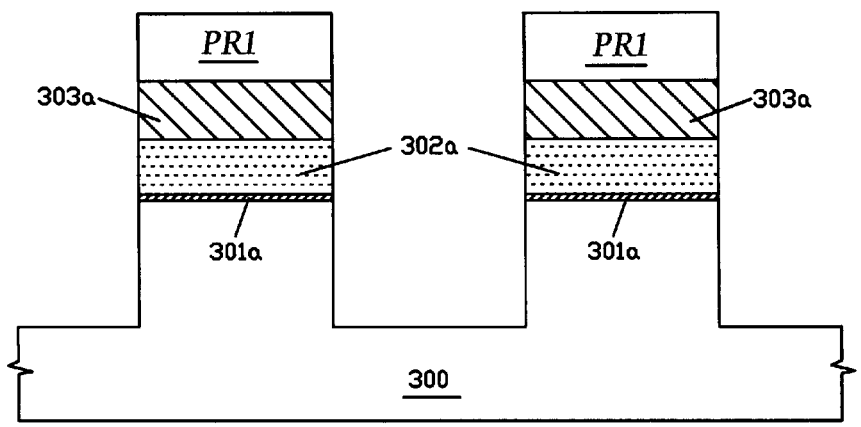

FIG. 2B shows that the first masking dielectric layer 303, the first conductive layer 302, and the tunneling-dielectric layer 301 outside of the plurality of masking photoresist PR1 are sequentially removed by using anisotropic dry etching, and then the semiconductor substrate 300 is anisotropically etched to form shallow trenches. The depth of the shallow trenches in the semiconductor substrate 300 is preferably between 4000 Angstroms and 10000 Angstroms.

Figure 2C:
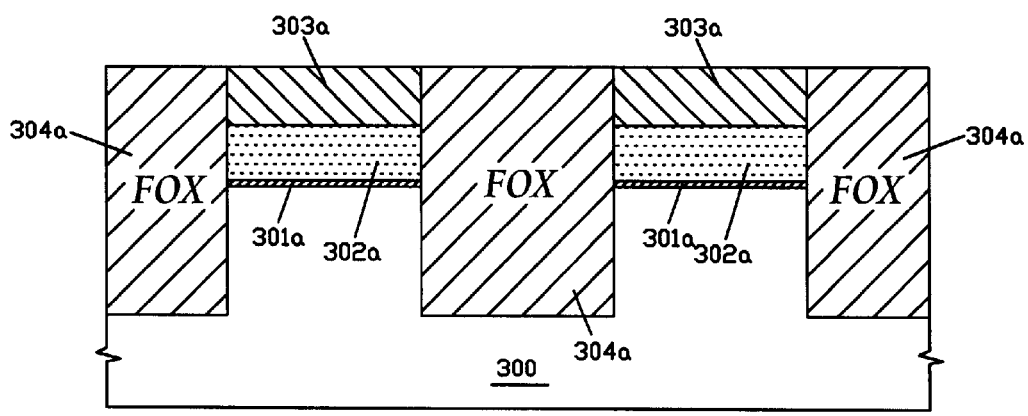

FIG. 2C shows that the plurality of masking photoresist PR1 are stripped and a planarized field-oxide layer 304a is formed to fill up each gap formed by the shallow trenches. The planarized field-oxide layer 304a is preferably made of silicon-oxide, phosphosilicate glass (P-glass) or borophosphosilicate glass (BP-glass) as deposited by high-density plasma CVD (HDPCVD) or plasma-enhanced CVD (PECVD) and is formed by first depositing a thick-oxide film 304 to fill up gaps and then planarizing the deposited thick-oxide film 304 using chemical-mechanical-polishing (CMP) with the first masking-dielectric layer 303a as a polishing stop. It should be noted that a thermal oxidation process can be performed to form a thin thermal-oxide layer over the trenched semiconductor surface to eliminate the trench-induced defects before forming the planarized field-oxide layers 304a.

Figure 2D:
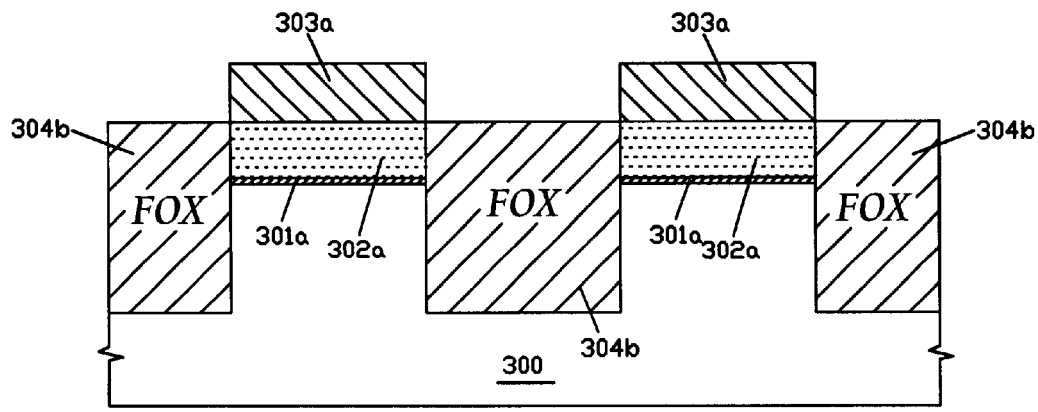

FIG. 2D shows that the planarized field-oxide layers 304a are etched back to a depth equal to a thickness of the first masking dielectric layer 303a by using anisotropic dry etching or wet etching to form first raised field-oxide layers 304b.

Figure 2E:
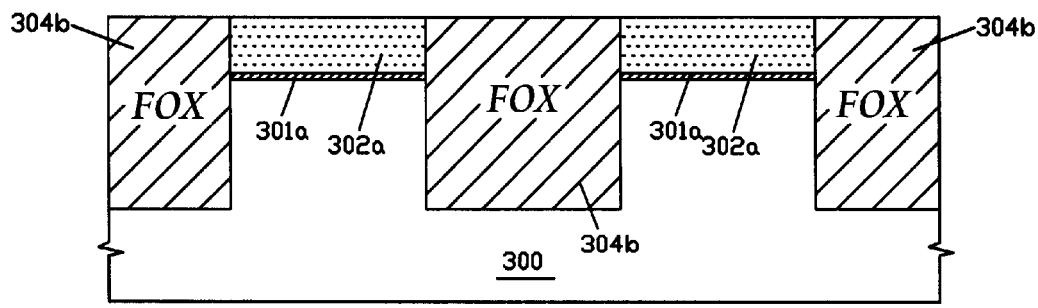

FIG. 2E shows that the first masking-dielectric layers 303a are selectively removed by using hot-phosphoric acid or anisotropic dry etching to form a STI structure with a flat surface being alternately formed by the first raised field-oxide layer 304b and the first conductive layer 302a. It should be noted that the flat surface is important for fine-line photolithography later on. It should be emphasized that the flat surface shown in FIG. 2E can be obtained by using a silicon-oxide film as a first masking-dielectric layer 303 or without the first masking dielectric layer 303.

Figure 2F:
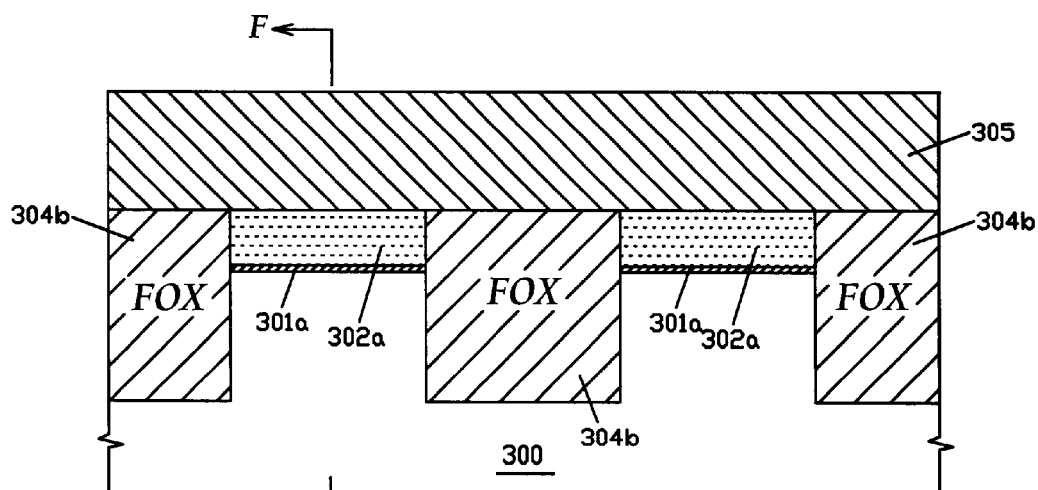

FIG. 2F shows that a second masking-dielectric layer 305 is formed over the STI structure. The second masking-dielectric layer 305 is preferably made of silicon-nitride as deposited by LPCVD and its thickness is preferably between 3000 Angstroms and 10000 Angstroms. The cross-sectional view along an active region as indicated by a F–F' line is shown in FIG. 3A.

Figure 3A:
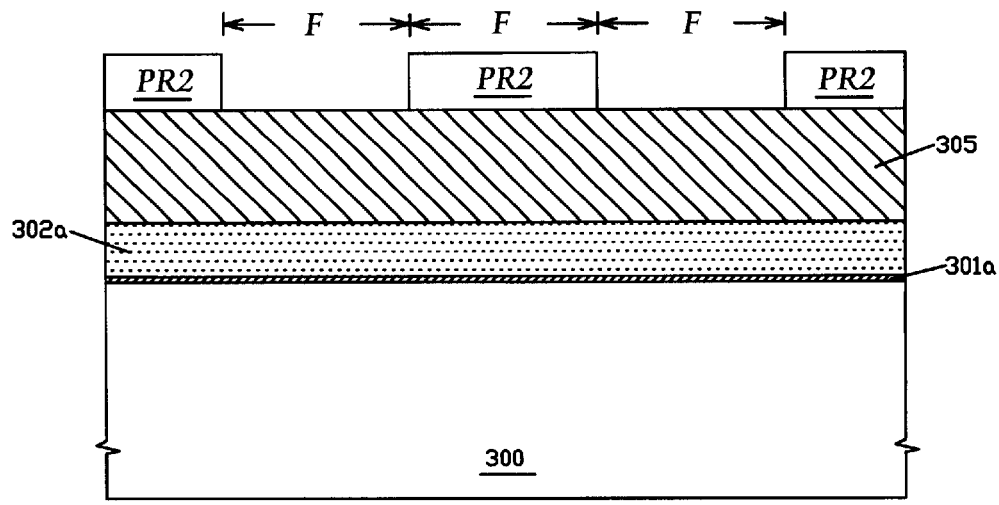
FIG. 3A through FIG. 3I show the process steps and their cross-sectional views of fabricating a stack-gate flash memory cell structure and its contactless flash memory arrays of the present invention.

Referring now to FIG. 3A through FIG. 3I, there are shown the process steps and their cross-sectional views of fabricating a stack-gate flash memory cell structure and its contactless flash memory arrays of the present invention. FIG. 3A shows that a plurality of masking photoresist PR2 are formed over the second masking-dielectric layer 305 to define a plurality of gate-stack regions (under PR2) and a plurality of common-source/drain regions (outside of PR2). The width and the space of the plurality of masking photoresist PR2 can be defined to be the minimum-feature-size (F) of technology used.

Figure 3B:
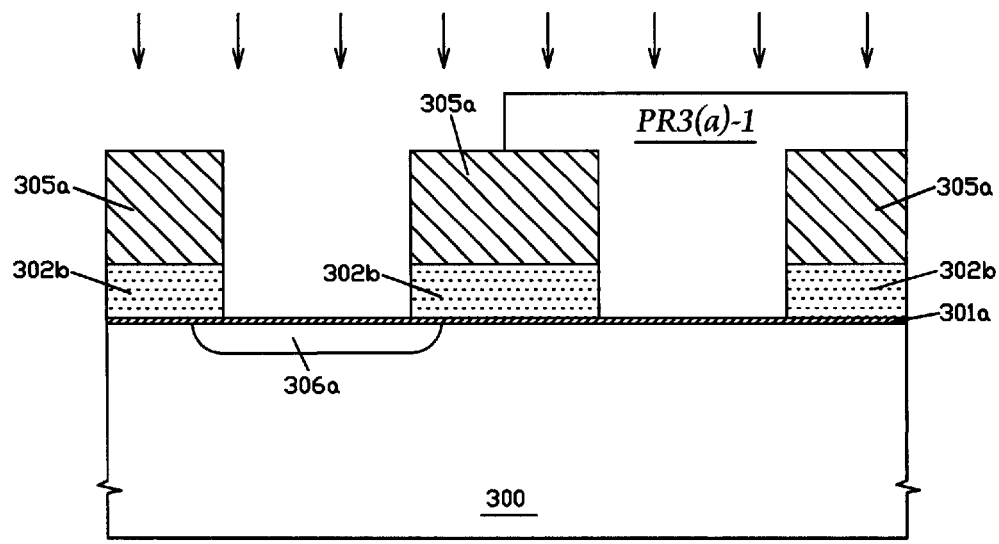

FIG. 3B shows that the second masking-dielectric layer 305 outside of the plurality of masking photoresist PR2 is removed by anisotropic dry etching and the first raised field-oxide layers 304b are then etched back to a depth equal to a thickness of the first conductive layer 302a to form second raised field-oxide layers 304c; and subsequently, the first conductive layers 302a are selectively removed by using anisotropic dry etching and the plurality of masking photoresist PR2 are then stripped. FIG. 3B also shows that a plurality of masking photoresist PR3(a)-1 are formed over the plurality of common-drain regions and a portion of nearby gate-stack regions and an ion-implantation is performed by implanting doping impurities across the tunneling-dielectric layer 301a into the semiconductor substrate 300 of the active regions in a self-aligned manner to form a plurality of lightly-doped common-source diffusion regions 306a of a second conductivity type along each of the plurality of common-source regions. For a p-type semiconductor substrate 300, the doping impurities are preferably phosphorous ions for forming the plurality of lightly-doped common-source diffusion regions 306a.

Figure 1A:
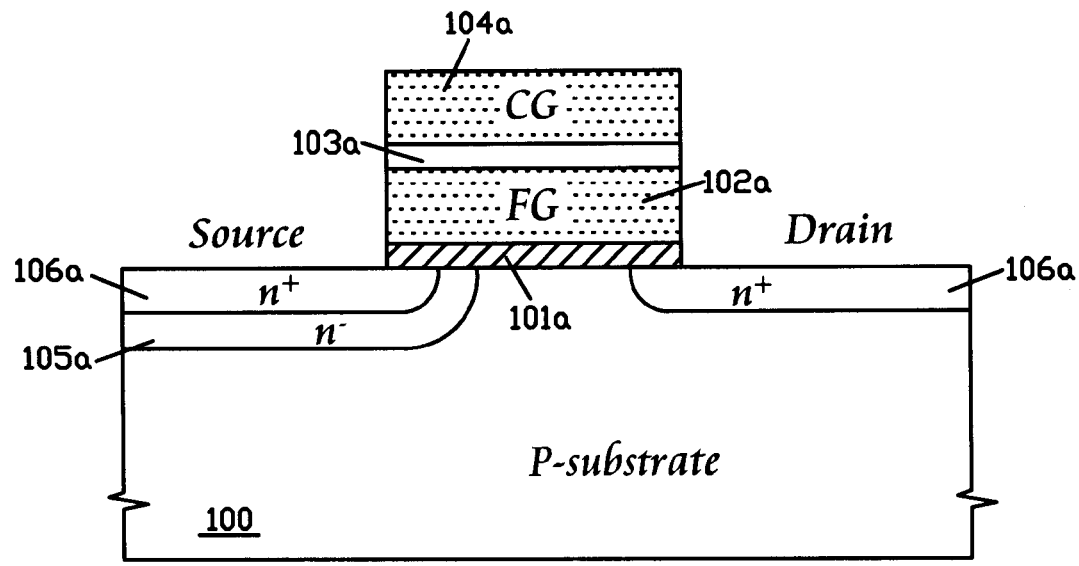
Figure 1B:
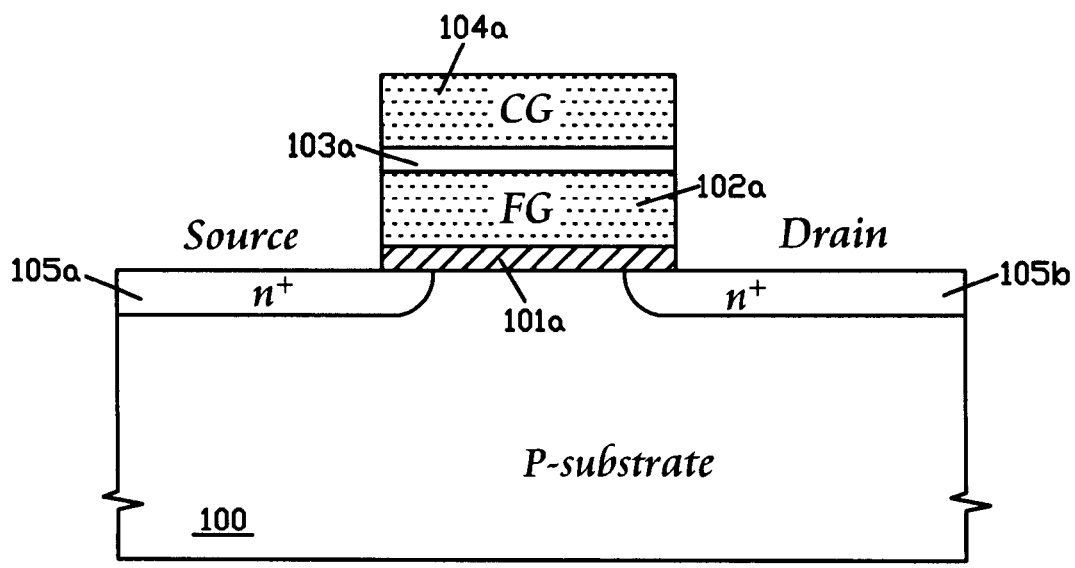
Figure 3C:
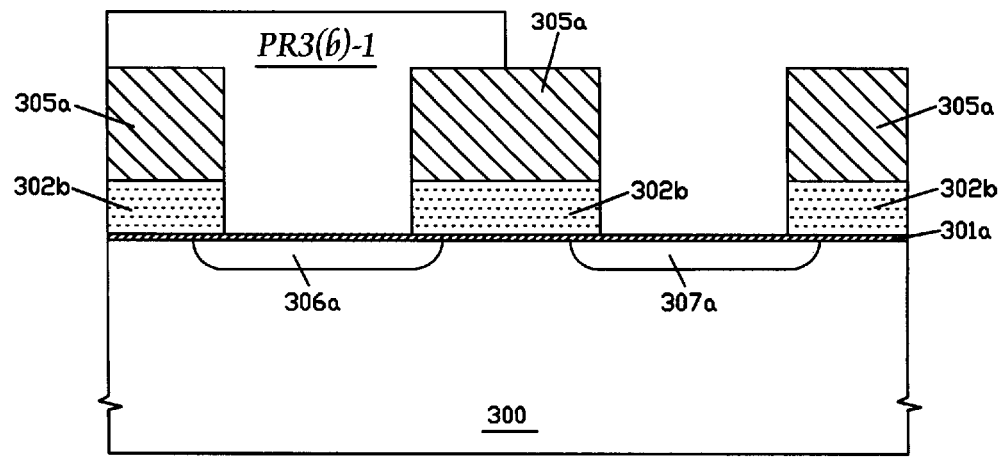

FIG. 3C shows that the plurality of masking photoresist PR3(a)-1 are stripped and a plurality of masking photoresist PR3(b)-1 are formed over the plurality of common-source regions and a portion of nearby gate-stack regions; an ion-implantation is performed by implanting doping impurities across the tunneling-dielectric layer 301a into the semiconductor-substrate 300 of the active regions in a self-aligned manner to from a plurality of lightly or moderately doped common-drain diffusion regions 307a of the first conductivity type; and a well-known rapid-thermal-annealing (RTA) process can be performed to activate the implanted doping impurities. For a p-type semiconductor substrate 300, the doping impurities are preferably boron ions for forming the plurality of lightly or moderately-doped common-drain diffusion regions 307a. It should be noted that the plurality of masking photoresist PR3(b)-1 can be formed by a reverse tone of the plurality of masking photoresist PR3(a)-1 with the same mask. It should be emphasized that the plurality of masking photoresist PR3(b)-1 aren't required if both the common-source region and the common-drain regions are simultaneously implanted with doping impurities of the second conductivity type to form shallow heavily-doped common-source/drain diffusion regions 306b/307b of the second conductivity type as that shown in FIG. 1A.

Figure 3D:
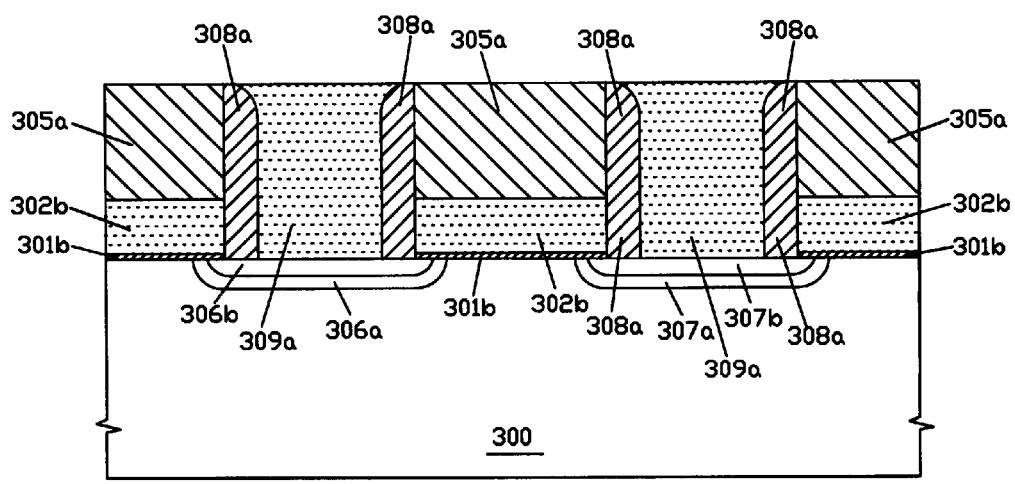

FIG. 3D shows that the plurality of masking photoresist PR3(b)-1 are stripped and an ion-implantation is performed by implanting doping impurities across the tunneling-dielectric layer 301a into the semiconductor substrate 300 of the active regions to form shallow heavily-doped common-source/drain diffusion regions 306b/307b of the second conductivity type within lightly-doped common-source/ moderately-doped common-drain diffusion regions 306a/ 307a of the second/first conductivity type. FIG. 3D also shows that the tunneling-dielectric layers 301a are removed by dipping in dilute hydrofluoric acid or using anisotropic dry etching and the second raised field-oxide layers 304c are simultaneously etched to form third raised field-oxide layers 304d; a first sidewall dielectric spacer 308a is then formed over each sidewall of the gate-stack regions and on a portion of first/second flat bed in each of the plurality of common-source/drain regions and subsequently, a planarized second conductive layer 309a is formed over the first/second flat bed between the first sidewall dielectric spacers 308a. The first/second flat bed is alternately formed by a third raised field-oxide layer 304d and a shallow heavily-doped common-source/drain diffusion region 306b/307b. The first sidewall dielectric spacer 308a is preferably made of silicon-dioxide as deposited by LPCVD and is formed by first depositing a silicon-dioxide layer 308 over the formed structure and then etching back a thickness of the deposited silicon-dioxide layer 308. The planarized second conductive layer 309a is preferably made of doped polycrystalline-silicon as deposited by LPCVD and is formed by first depositing a thick second conductive layer 309 to fill up gaps between the first sidewall dielectric spacers 308a and then planarizing the deposited second conductive layer 309 by using CMP with the second masking dielectric layer 305a as a polishing stop.

Figure 3E:
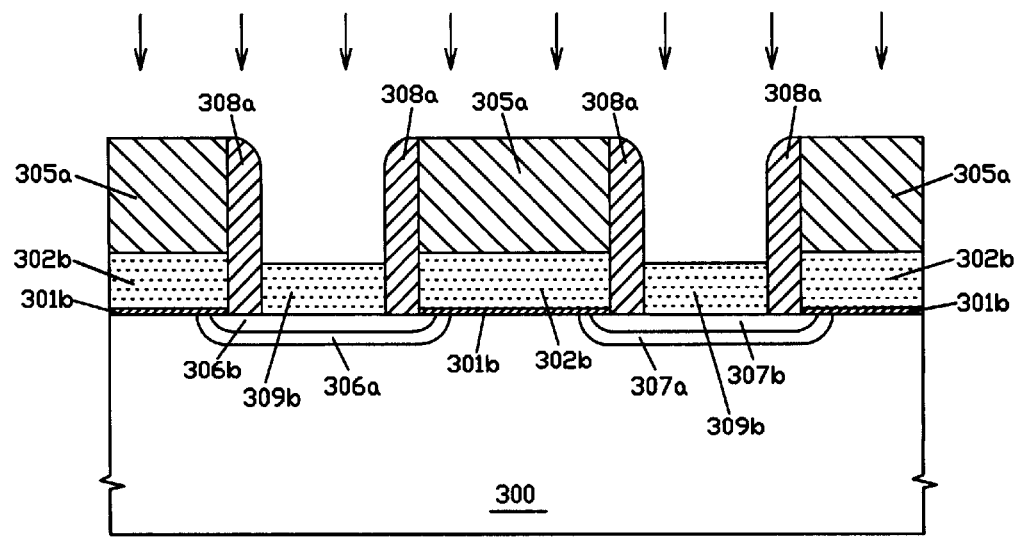
Figure 3E:
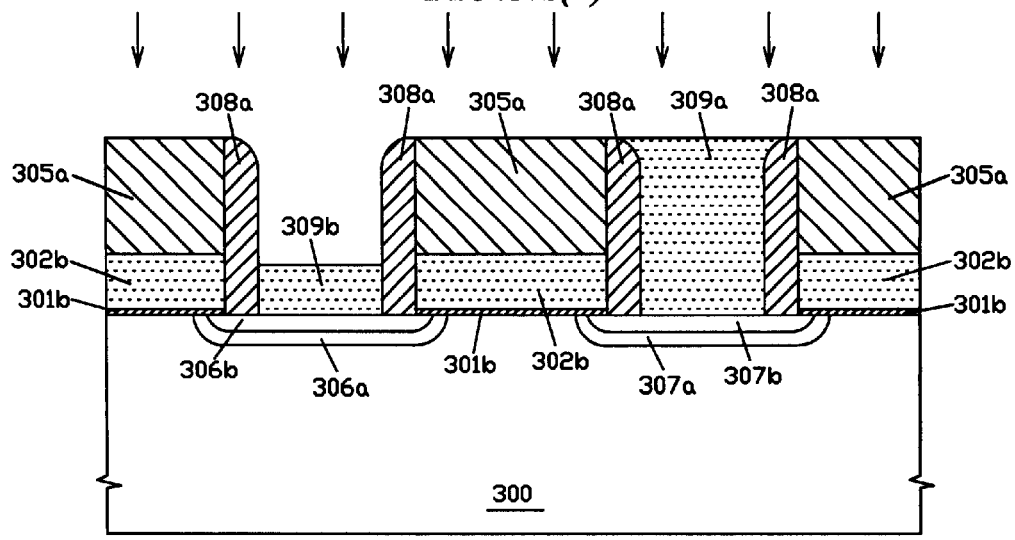

FIG. 3E(a) shows that the planarized second conductive layers 309a are etched back to a depth slightly larger than a thickness of the second masking dielectric layer 305a and an ion-implantation is performed to heavily dope the etched-back planarized second conductive layers 309b. It should be noted that a metal-silicide layer (not shown) can be formed over the etched-back planarized second conductive layers 309b by using a well-known self-aligned silicidation process and the metal-silicide layer is preferably made of refractory metal-silicides such as cobalt-disilicide ($CoSi_2$) or titanium-disilicide ($TiSi_2$); the metal-silicide layer can be formed by first depositing a tungsten-disilicide layer and then planarizing and etching back. Similarly, a metal layer such as tungsten can be formed over the etched-back planarized second conductive layers 309b by first depositing a tungsten layer and then planarizing and etching back. The composite second conductive layer including a capping metal-silicide layer or a metal layer is used as a common-source/drain conductive bus line and is also marked by 309b.

FIG. 3E(b) shows that a plurality of masking photoresist PR3(a)-2 (not shown) are formed over the plurality of common-drain regions and a portion of nearby gate-stack regions and the etching-back process is performed to etch the planarized second conductive layer 309a in each of the plurality of common-source regions to form an etched-back planarized second conductive layer 309b; and subsequently, the plurality of masking photoresist PR3(a)-2 are stripped, and then an ion-implantation is performed to heavily dope the planarized second conductive layers 309a and the etched-back planarized second conductive layers 309b. Similarly, a metal-silicide layer (not shown) can be formed over each of the etched-back planarized second conductive layers 309b and each of the planarized second conductive layers 309a by using the well-known self-aligned silicidation process. It should be noted that the plurality of masking photoresist PR3(a)-2 can be patterned by using the same photomask for forming the plurality of masking photoresist PR3(a)-1.

Figure 3F:
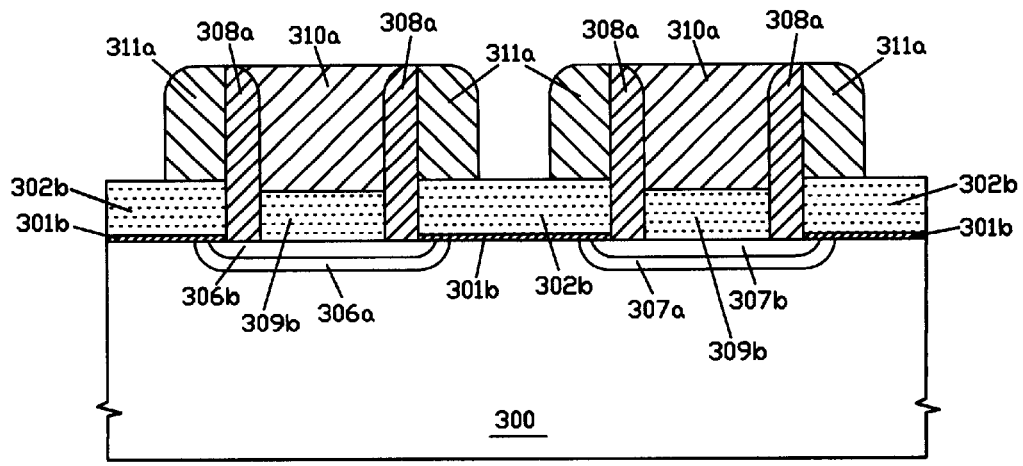
Figure 3F:
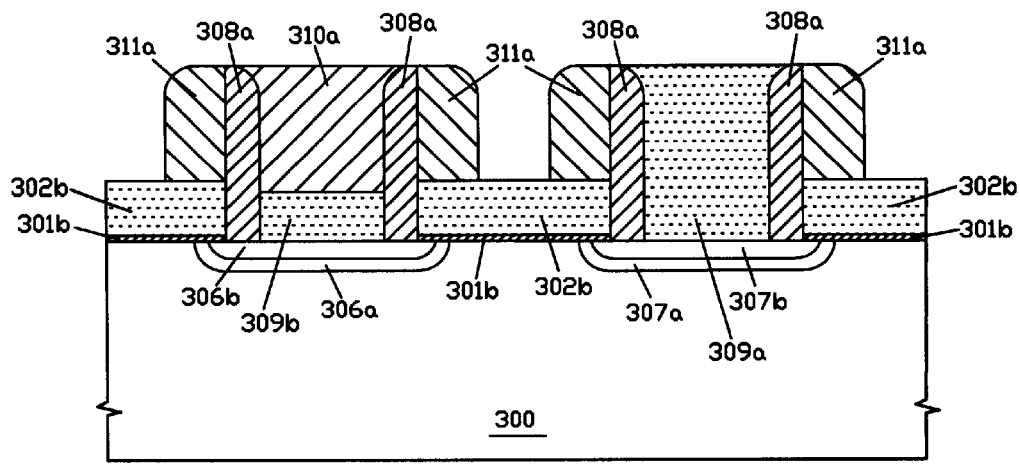

FIG. 3F(a) shows that a planarized thick-oxide layer 310a is formed over each of the common-source/drain conductive bus lines 309b and the second masking dielectric layers 305a are then selectively removed by preferably using hot-phosphoric acid or anisotropic dry etching; and subsequently, a second sidewall dielectric spacer 311a is formed over each sidewall of the first sidewall dielectric spacers 308a and on a portion of the flat surface being alternately formed by the first raised field-oxide layer 304b and the first conductive layer 302b. The planarized thick-oxide layer 310a is preferably made of silicon-dioxide, P-glass, or BP-glass as deposited by LPCVD, HDPCVD, or PECVD and is formed by first depositing a thick-oxide film 310 to fill up gaps between the first sidewall dielectric spacers 308a and then planarizing the deposited thick-oxide film 310 using CMP with the second masking dielectric layer 305a as a polishing stop. The second sidewall dielectric spacer 311a is preferably made of silicon-nitride as deposited by LPCVD and is formed by first depositing a second dielectric layer 311 over the formed structure and then etching back a thickness of the deposited second dielectric layer 311.

FIG. 3F(b) shows that a planarized thick-oxide layer 310a is formed over each of the common-source conductive bus lines 309b and the second masking dielectric layers 305a are selectively removed by preferably using hot-phosphoric acid or anisotropic dry etching; and subsequently, a second sidewall dielectric spacer 311a is formed over each sidewall of the first sidewall dielectric spacers 308a and a on portion of the flat surface being alternately formed by the first raised field-oxide layer 304b and the first conductive layer 302b.

Figure 3G:
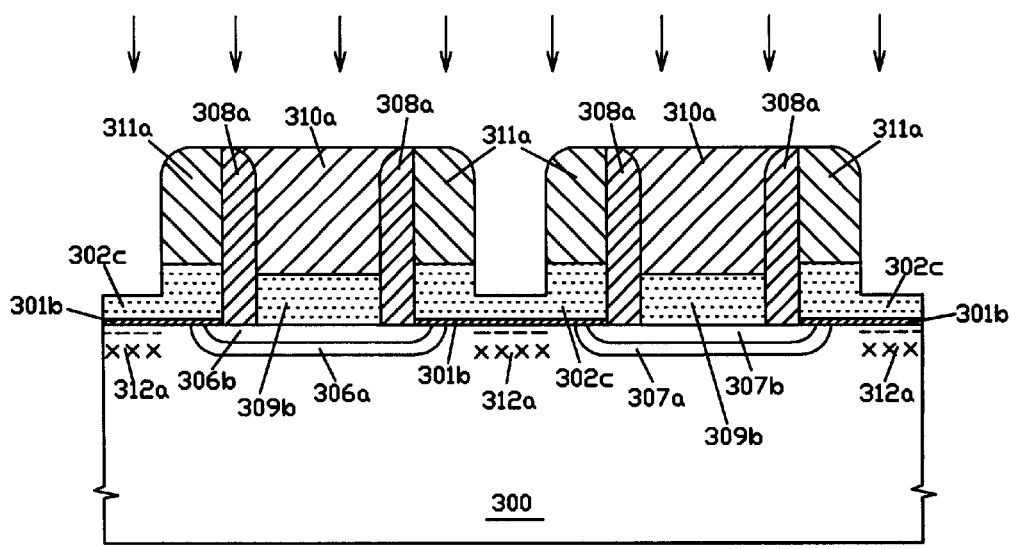
Figure 3G:
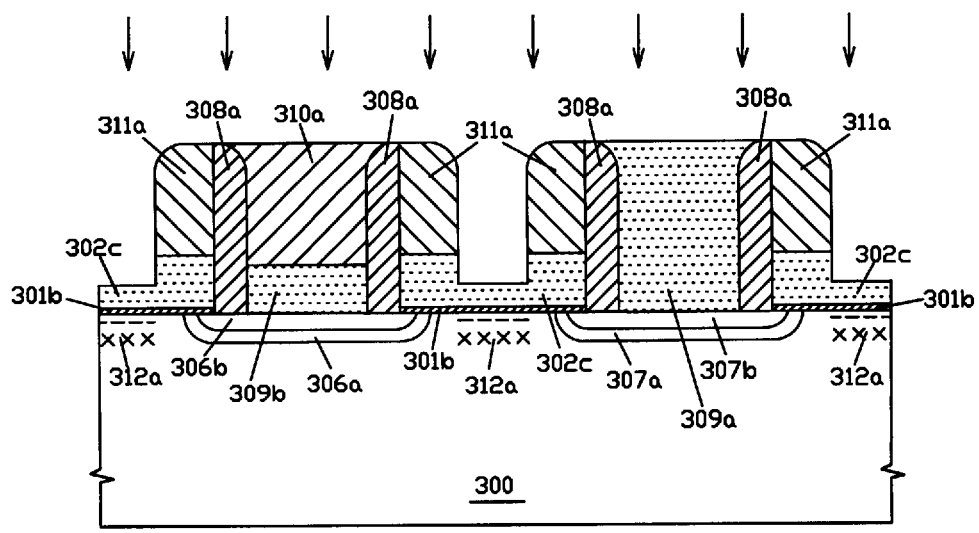

FIG. 3G(a) shows that the first conductive layers 302b between the second sidewall dielectric spacers 311a are etched back to form thin floating-gate layers in central portions and ion-implantations are performed by implanting doping impurities across the thin floating-gate layer in a self-aligned manner to form an implanted region 312a of said first conductivity type under each of the floating-gate structure 302c. The thickness of the thin floating-gate layers is preferably between 200 Angstroms and 500 Angstroms. The implanted region 312a may include a shallow implant region as marked by the dash line for threshold-voltage adjustment and the deeper implant region as marked by the cross symbols for forming a punch-through stop.

FIG. 3G(b) shows that a plurality of masking photoresist PR4 (not shown) are formed over the common-drain regions and nearby second sidewall dielectric spacers 311a and the first conductive layers 302b between the second sidewall dielectric spacers 311a are etched back to form thin floating-gate layers in central portions; and ion-implantations are then performed to form an implanted region 312a as discussed in FIG. 3G(a) and the plurality of masking photoresist PR4 are stripped. It should be noted that the plurality of masking photoresist PR4 aren't required if a thin thermal poly-oxide layer is formed over each of the planarized second conductive layers 309a in FIG. 3D or after the formation of the planarized thick-oxide layers 310a in FIG. 3F(b).

From FIG. 3G(a) and FIG. 3G(b), it is clearly seen that the width of the implanted regions 312a can be easily controlled by the spacer width of the second sidewall dielectric spacers 311a and the drain electric field distribution can be relatively easy to be controlled. Moreover, a large tilt-angle implantation (not shown) can be performed to form a punch-through stop and simultaneously to tailor the drain electric field.

Figure 3H:
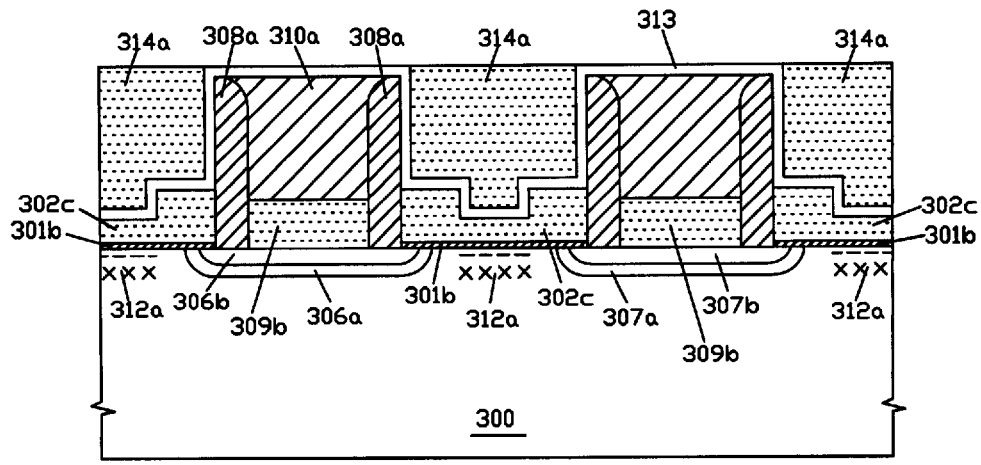
Figure 3H:
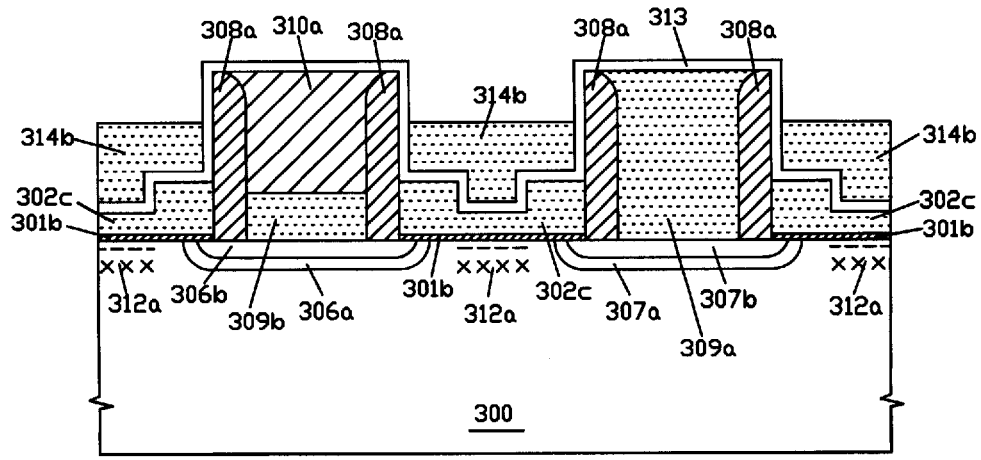

FIG. 3H(a) shows that the second sidewall dielectric spacers 311a are preferably removed by hot-phosphoric acid and an intergate-dielectric layer 313 is formed over the formed structure, and a planarized third conductive layer 314a is then formed over each of the gate-stack regions. The intergate-dielectric layer 313 is preferably a composite dielectric layer such as an oxide-nitride-oxide (ONO) structure or a nitride-oxide (NO) structure and its equivalent-oxide thickness is preferably between 80 Angstroms and 120 Angstroms. The planarized third conductive layer 314a is preferably made of doped polycrystalline-silicon as deposited by LPCVD and is formed by first depositing a thick third conductive layer 314 to fill up gaps formed in each of the gate-stack regions and then planarizing the deposited thick third conductive layer 314 using CMP with the intergate-dielectric layer 313 as a polishing stop.

FIG. 3H(b) shows the planarized third conductive layers 314a shown in FIG. 3H(a) are etched back and a metal-silidide layer (not shown) is formed over the etched-back planarized third conductive layer 314b by the well-known self-aligned silicidation process. It should be noted that an ion-implantation can be performed by implanting a high dose of doping impurities of the second conductivity type into the planarized second conductive layers 309a and the etched-back planarized third conductive layers 314b simultaneously. It should be emphasized that a planarized metal layer can be formed over the etched-back planarized third conductive layer 314b to form a composite control-gate conductive layer in each of the gate-stack regions.

Figure 3I:
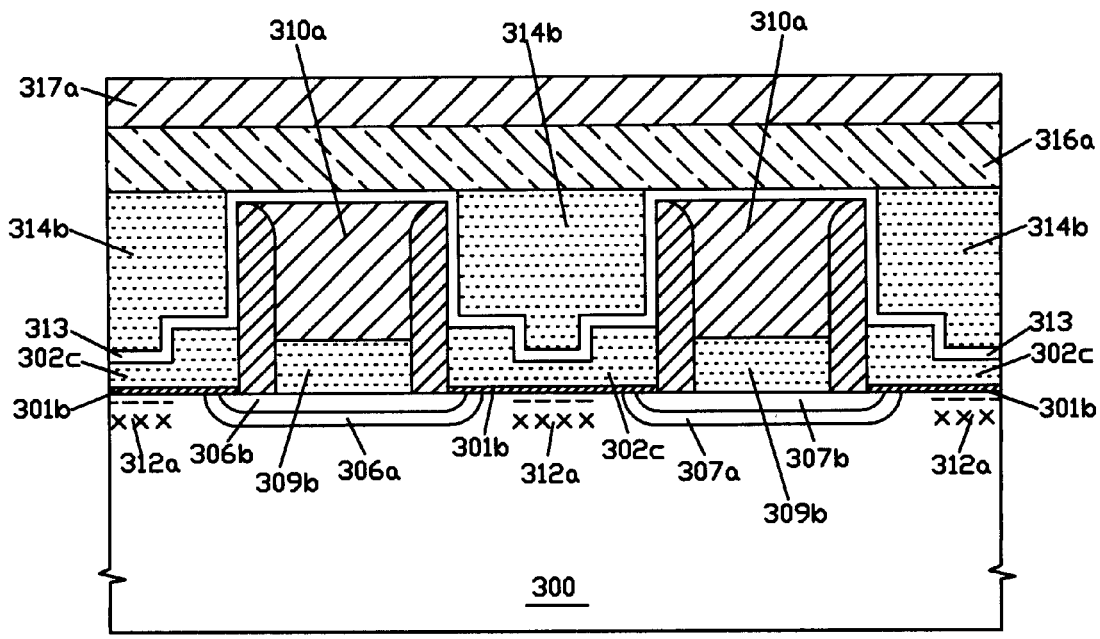
Figure 3I:
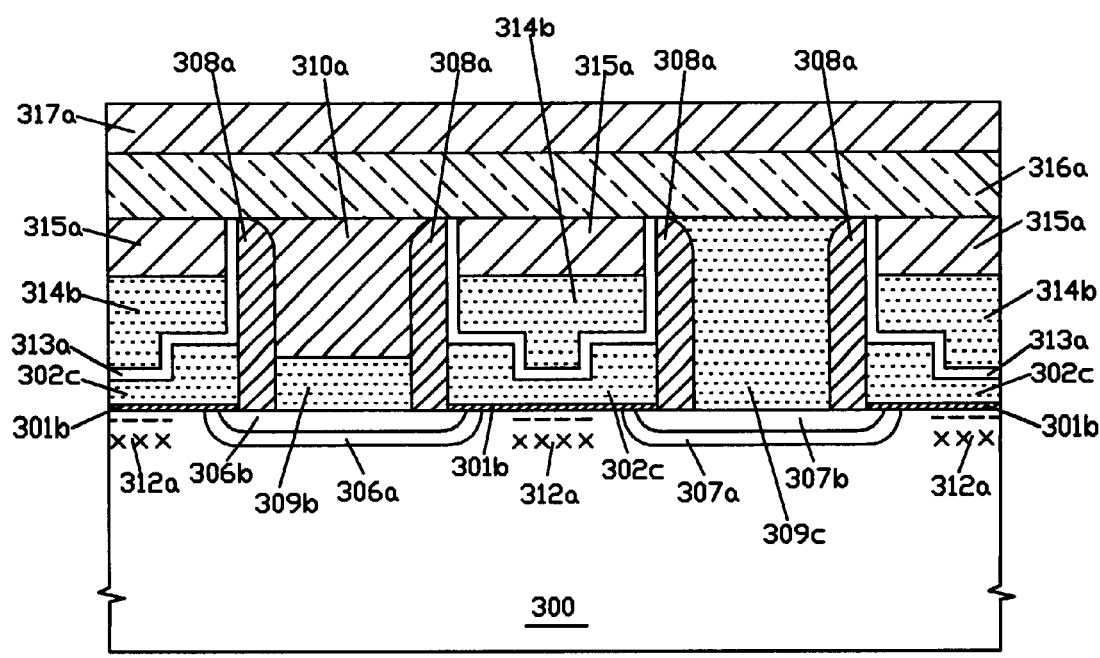

FIG. 3I(a) shows that a metal layer 316 is formed over the formed structure and is patterned to be aligned to the plurality of active regions by a masking step, and the metal layer 316 and the planarized third conductive layers 314a are simultaneously etched to form a plurality of metal word lines 316a integrated with a plurality of planarized control-gate conductive islands 314b for forming a contactless parallel common-source/drain bit-line flash memory array of the present invention. The masking step may comprise a plurality of masking photoresist or a plurality of hard masking dielectric layers 317a being aligned to the plurality of active regions and a sidewall dielectric spacer 318a can be formed on each sidewall of the plurality of hard masking dielectric layers 317a to eliminate misalignment. It should be noted that the planarized third conductive layer 314a is preferably silicided to form a refractory metal-silicide layer and the metal layer 316a is preferably an aluminum or copper layer over a barrier-metal layer such as a titanium-nitride (TiN) or tantalum-nitride (TaN) layer.

FIG. 3I(b) shows that a planarized capping-oxide layer 315a is formed over each of the composite control-gate conductive layers 314b, and a metal layer 316 is then formed over the formed structure and is patterned by the masking step as described in FIG. 3I(a); and the metal layer 316 and the planarized second conductive layers 309a are simultaneously etched to form a plurality of metal bit-lines 316a integrated with a plurality of planarized second conductive islands 309c for forming a contactless NOR-type flash memory array of the present invention. It should be noted that the intergate-dielectric layer 313 over the planarized thick-oxide layers 310a and the planarized second conductive layers 309a are removed by the CMP process and the thin thermal poly-oxide layer over each of the planarized second conductive layers 309a is also removed. The exposed planarized second conductive layer 309a is preferably silicided to form a refractory-metal silicide layer before forming the metal layer 316. Similarly, the metal layer 316 may comprise an aluminum or copper layer being formed on a barrier-metal layer such a titanium-nitride (TiN) or tantalum-nitride (TaN) layer.

Figure 4:
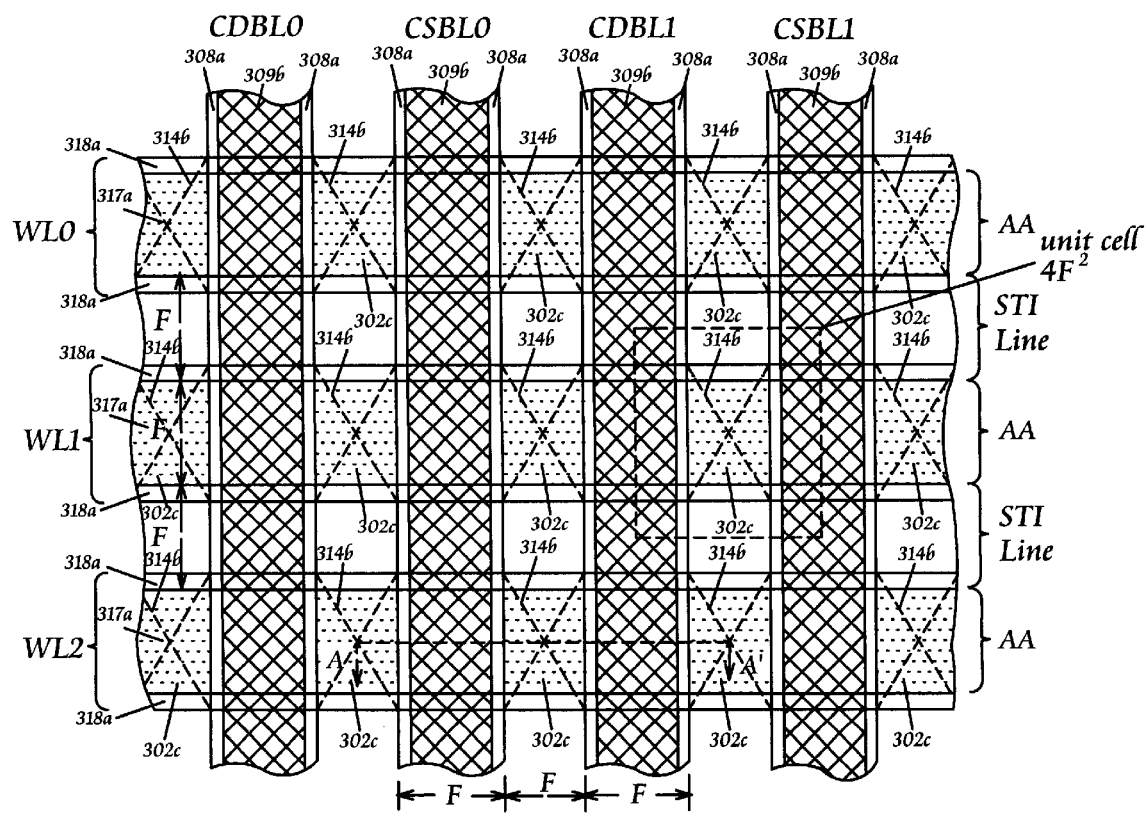
FIG. 4 shows a top plan view of a contactless parallel common-source/drain conductive bit-line flash memory array of the present invention.

FIG. 4 shows a top plan view of the contactless parallel common-source/drain conductive bit-line flash memory array, in which a cross-sectional view along a A–A' line is shown in FIG. 3I(a). From FIG. 4, it is clearly seen that the plurality of common-source conductive bit-lines (CSBL's) and the plurality of common-drain conductive bit-lines (CDBL's) are formed in parallel and transversely to the plurality of parallel STI regions; and the plurality of metal word-lines (WL's) integrated with the plurality of planarized control-gate conductive islands 314b are formed transversely to the plurality of common-source/drain conductive bit-lines (CSBL's/CDBL's).

Figure 5:
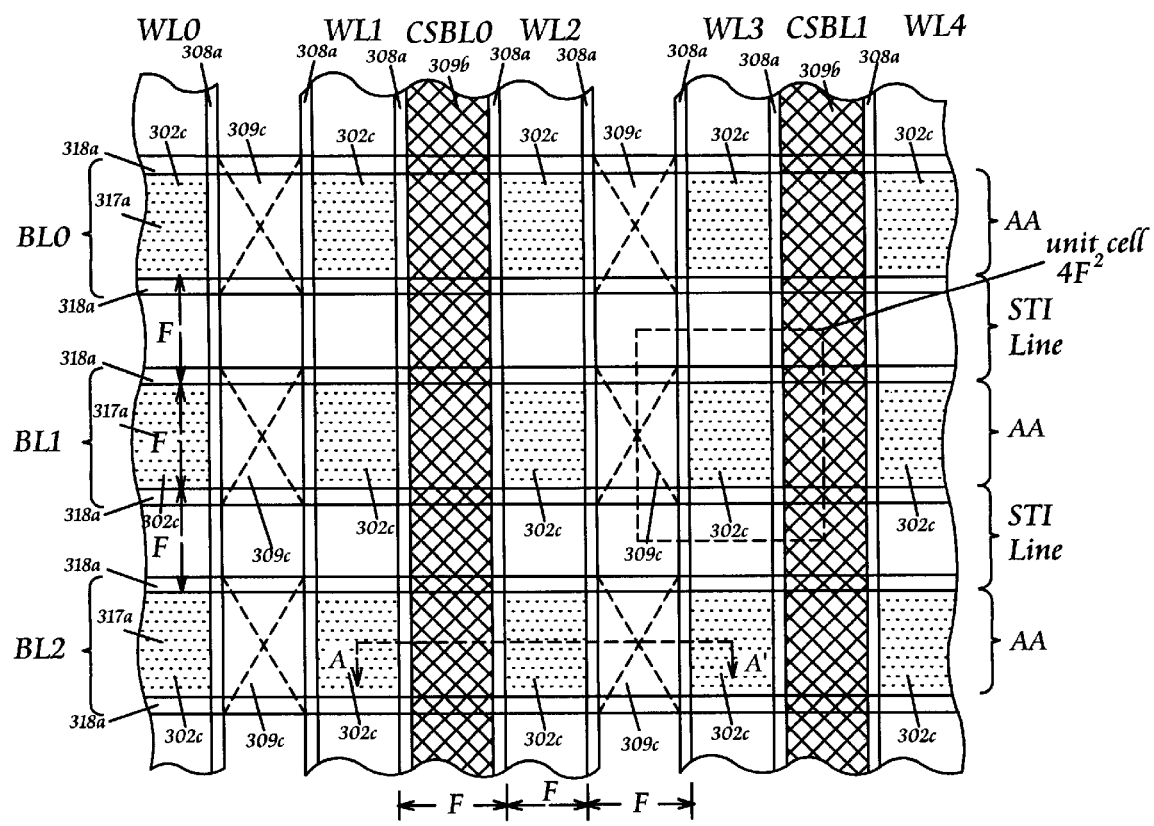
FIG. 5 shows a top plan view of a contactless NOR-type flash memory array of the present invention.

FIG. 5 shows a top plan view of the contactless NOR-type flash memory array, in which a cross-sectional view along a A–A' line is shown in FIG. 3I(b). From FIG. 5, it is clearly seen that the plurality of common-source conductive bus lines (CSBL's) are formed alternately and transversely to the plurality of parallel STI regions; and the plurality of metal bit-lines (BL's) integrated with the plurality of planarized common-drain conductive islands 309c are patterned simultaneously to be aligned to the plurality of active regions (AA's) and are formed transversely to the plurality of common-source conductive bus lines (CSBL's).

From FIG. 4 and FIG. 5, it is clearly seen that the cell size is 4F² as marked by a dash square.

Accordingly, the advantages and the features of the stack-gate flash memory cell structure and its contactless flash memory arrays of the present invention can be summarized as below:

(a) The stack-gate flash memory cell structure of the present invention offers a floating-gate structure having a thin floating-gate layer formed in a central portion to form an efficient punch-through stop in a central portion of a channel for a scaled stack-gate flash memory cell.

(b) The stack-gate flash memory cell structure of the present invention offers a floating-gate structure with a larger surface area to increase the coupling ratio of a scaled stack-gate flash memory cell.

(c) The stack-gate flash memory cell structure of the present invention offers a cell size of 4F² and can be scaled with allivating the punch-through effect and without concerning the contact problems for shallow source/drain junction depth.

(d) The contactless parallel common-source/drain conductive bit-line flash memory array of the present invention offers highly conductive bit-lines and metal word lines for high-speed read operation in a high-density flash memory array.

(e) The contactless NOR-type flash memory array of the present invention offers highly conductive common-source bus lines, highly conductive word lines, and metal bit-lines for high-speed read operation in a high-density flash memory array.

While the present invention has been particularly shown and described with reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A stack-gate flash memory cell, comprising:

a semiconductor substrate of a first conductivity type;

a cell region having an active region and two parallel shallow-trench-isolation (STI) regions formed on said semiconductor substrate and being divided into three regions: a common-source region, a gate-stack region, and a common-drain region, wherein said gate-stack region having a gate-stack is located between said common-source region and said common-drain region;

a common-source diffusion region of a second conductivity type being formed by implanting doping impurities in a self-aligned manner into said semiconductor substrate of said active region in said common-source region;

a first flat bed being formed by said common-source diffusion region and nearby third raised field-oxide layers and a first sidewall dielectric spacer being formed over one sidewall of said gate-stack in said gate-stack region and on a portion of said first flat bed;

a common-source conductive layer being formed over said first flat bed outside of said first sidewall dielectric spacer and a planarized thick-oxide layer being formed over said common-source conductive layer and said first sidewall dielectric spacer;

a common-drain diffusion region being formed by implanting doping impurities in a self-aligned manner into said semiconductor substrate of said active region in said common-drain region;

a second flat bed being formed by said common-drain diffusion region and said nearby third raised field-oxide layers, and said first sidewall dielectric spacer being formed over another sidewall of said gate-stack and on a portion of said second flat bed;

a common-drain conductive layer being formed over said second flat bed outside of said first sidewall dielectric spacer and said planarized thick-oxide layer being formed over said common-drain conductive layer and said first sidewall dielectric spacer;

a floating-gate structure being formed on a tunneling-dielectric layer and having a thinner floating-gate layer formed in a central portion of said active region in said gate-stack region, wherein an implanted region of said first conductivity type is formed in a central portion of a channel and under said thinner floating-gate layer and two first raised field-oxide layers being separately formed in said two parallel STI regions are located in said gate-stack region;

an intergate-dielectric layer being at least formed in said gate-stack region and over said floating-gate structure, said two first raised field-oxide layers, and each inner sidewall of said first sidewall dielectric spacers; and a metal word-line integrated with a planarized control-gate conductive island being simultaneously patterned to be aligned above said active region, wherein said planarized control-gate conductive island is formed over said intergate-dielectric layer.

2. The stack-gate flash memory cell according to claim 1, wherein said common-source diffusion region comprises a shallow heavily-doped diffusion region formed within a lightly-doped diffusion region.

3. The stack-gate flash memory cell according to claim 1, wherein said common-drain diffusion region comprises a shallow heavily-doped diffusion region of said second conductivity type or a shallow heavily-doped diffusion region of said second conductivity type formed within a moderately-doped diffusion region of said first conductivity type.

4. The stack-gate flash memory cell according to claim 1, wherein said thinner floating-gate layer is defined by a pair of second sidewall dielectric spacers being formed over said inner sidewalls of said gate-stack.

5. The stack-gate flash memory cell according to claim 1, wherein said implanted region comprises a shallow implant region for threshold-voltage adjustment and a deeper implant region for forming a punch-through stop.

6. The stack-gate flash memory cell according to claim 1, wherein said planarized control-gate conductive island comprises a heavily-doped polycrystalline-silicon island or a heavily-doped polycrystalline-silicon island capped or silicided with a refractory metal-silicide layer.

7. The stack-gate flash memory cell according to claim 1, wherein said common-source/drain conductive layer comprises a heavily-doped polycrystalline-silicon layer or a heavily-doped polycrystalline-silicon layer capped or silicided with a refractory-metal silicide layer.

8. The stack-gate flash memory cell according to claim 1, wherein said metal word-line comprises an aluminum or copper layer over a barrier-metal layer.

9. A stack-gate flash memory cell, comprising:
a semiconductor substrate of a first conductivity type;
a cell region having an active region and two parallel STI regions formed on said semiconductor substrate and being divided into three regions: a common-source region, a gate-stack region, and a common-drain region, wherein said gate-stack region having a gate-stack is located between said common-source region and said common-drain region;
a common-source diffusion region of a second conductivity type being formed by implanting doping impurities in a self-aligned manner into said semiconductor substrate of said active region in said common-source region;
a first flat bed being formed by said common-source diffusion region and nearby third raised field-oxide layers and a first sidewall dielectric spacer being formed over one sidewall of said gate-stack in said gate-stack region and on a portion of said first flat bed;
a common-source conductive layer being formed over said first flat bed outside of said first sidewall dielectric spacer and a first planarized thick-oxide layer being formed over said common-source conductive layer and said first sidewall dielectric spacer;
a common-drain diffusion region being formed by implanting doping impurities in a self-aligned manner into said semiconductor substrate of said active region in said common-drain region;
a second flat bed being formed by said common-drain diffusion region and said nearby third raised field-oxide layers, and said first sidewall dielectric spacer being formed over another sidewall of said gate-stack and on a portion of said second flat bed;
a planarized common-drain conductive island being at least formed over said common-drain diffusion region outside of said first sidewall dielectric spacer;
a floating-gate structure being formed on a tunneling-dielectric layer and having a thinner floating-gate layer formed in a central portion of said active region in said gate-stack region, wherein an implanted region of said first conductivity type is formed in a central portion of a channel and under said thinner floating-gate layer and two first raised field-oxide layers being separately formed in said two parallel STI regions are located in said gate-stack region;
an intergate-dielectric layer being formed in said gate-stack region and over said floating-gate structure, said two first raised field-oxide layers, and each inner sidewall of said first sidewall dielectric spacers;
a control-gate conductive layer capped with a planarized capping-oxide layer being formed on said intergate-dielectric layer in said gate-stack region; and
a metal bit-line integrated with said planarized common-drain conductive island being simultaneously patterned to be aligned above said active region.

10. The stack-gate flash memory cell according to claim 9, wherein said common-source diffusion region comprises a shallow heavily-doped diffusion region formed within a lightly-doped diffusion region.

11. The stack-gate flash memory cell according to claim 9, wherein said common-source conductive layer comprises a heavily-doped polycrystalline-silicon layer or a heavily-doped polycrystalline-silicon layer capped or silicided with a refractory-metal silicide layer.

12. The stack-gate flash memory cell according to claim 9, wherein said common-drain diffusion region comprises a heavily-doped diffusion region of said second conductivity type or a heavily-doped diffusion region of said second conductivity type formed within a moderately-doped diffusion region of said first conductivity type.

13. The stack-gate flash memory cell according to claim 9, wherein said planarized common-drain conductive island comprises a heavily-doped polycrystalline-silicon island or a heavily-doped polycrystalline-silicon island capped or silicided with a refractory-metal silicide layer.

14. The stack-gate flash memory cell according to claim 9, wherein said thinner floating-gate layer is defined by a pair of second sidewall dielectric spacers being formed over inner sidewall of said gate-stack.

15. The stack-gate flash memory cell according to claim 9, wherein said implanted region comprises a shallow implant region for threshold-voltage adjustment and a deeper implant region for forming a punch-through stop.

16. The stack-gate flash memory cell according to claim 9, wherein said control-gate conductive layer being acted as a word line comprises a heavily-doped polycrystalline-silicon layer capped or silicided with a refractory-metal silicide layer or a heavily-doped polycrystalline-silicon layer capped with a metal layer.

17. A contactless flash memory array, comprising:
a semiconductor substrate of a first conductivity type;
a shallow-trench-isolation (STI) structure having a plurality of active regions and a plurality of parallel STI regions formed alternately on said semiconductor substrate;
a plurality of gate-stack regions being formed between a plurality of common-source regions and a plurality of common-drain regions, wherein the plurality of gate-stack regions are formed on said STI structure and transversely to the plurality of parallel STI regions;
each of the plurality of common-source regions comprising: a first flat bed being alternately formed by a common-source diffusion region of a second conductivity type with a double-diffused structure and a third raised field-oxide layer, a pair of first sidewall dielectric spacers being formed over each sidewall of nearby gate-stacks and on a portion of said first flat bed, a common-source conductive bit-line being formed over said first flat bed between said pair of first sidewall dielectric spacers, and a planarized thick-oxide layer being formed over said common-source conductive bit-line between said pair of first sidewall dielectric spacers;
each of the plurality of common-drain regions comprising: a second flat bed being alternately formed by a common-drain diffusion region and said third raised field-oxide layers, another pair of first sidewall-dielectric spacers being formed over another sidewall of nearby gate-stacks and on a portion of said second flat bed, a common-drain conductive bit-line being formed over said second flat bed between said another pair of first sidewall-dielectric spacers, and said planarized thick-oxide layer being formed over said common-drain conductive bit-line between said another pair of first sidewall-dielectric spacers;
each of the plurality of gate-stack regions comprising: a floating-gate structure being formed over a tunneling-dielectric layer in each of the plurality of active regions and having a thinner floating-gate layer formed in a central portion, a first raised field-oxide layer being located in each of the plurality of parallel STI regions, an implanted region of said first conductivity type including a shallow implant region for threshold-voltage adjustment and a deeper implant region for forming a punch-through stop being formed in a central portion of a channel in each of the plurality of active regions, an intergate-dielectric layer being at least formed over the plurality of floating-gate structures and the plurality of first raised field-oxide layers, and a plurality of planarized control-gate conductive islands being at least formed on the plurality of floating-gate structures spaced by said intergate-dielectric layer; and a plurality of metal word-lines integrated with the plurality of planarized control-gate conductive islands being simultaneously patterned to align above the plurality of active regions.

18. The contactless flash memory array according to claim 17, wherein said common-drain diffusion region comprises a shallow heavily-doped diffusion region of said second conductivity type or a shallow heavily-doped diffusion region of said second conductivity type formed within a moderately-doped diffusion region of said first conductivity type.

19. A contactless flash memory array, comprising:

a semiconductor substrate of a first conductivity type;

a shallow-trench-isolation (STI) having a plurality of active regions and a plurality of parallel STI regions formed alternately on said semiconductor substrate;

a plurality of gate-stack regions being formed between a plurality of common-source regions and a plurality of common-drain regions, wherein the plurality of gate-stack regions are formed on said STI structure and transversely to the plurality of parallel STI regions;

each of the plurality of common-source regions comprising: a first flat bed being alternately formed by a common-source diffusion region of a second conductivity type with a double-diffused structure and a third raised field-oxide layer, a pair of first sidewall dielectric spacers being formed over each sidewall of nearby gate-stacks and on a portion of said first flat bed, a common-source conductive bus-line being formed over said first flat bed between said pair of first sidewall dielectric spacers, and a planarized thick-oxide layer being formed over said common-source conductive bus-line between said pair of first sidewall dielectric spacers;

each of the plurality of common-drain regions comprising: a second flat bed being alternately formed by a common-drain diffusion region and said third raised field-oxide layer, another pair of first sidewall-dielectric spacers being formed over another sidewall of nearby gate-stacks, and a plurality of planarized common-drain conductive islands being at least formed over said common-drain diffusion regions between said another pair of first sidewall-dielectric spacers;

each of the plurality of gate-stack regions comprising: a floating-gate structure being formed over a tunneling-dielectric layer in each of the plurality of active regions and having a thinner floating-gate layer formed in a central portion, a first raised field-oxide layer being located in each of the plurality of parallel STI regions, an implanted region of said first conductivity type including a shallow implant region for threshold-voltage adjustment and a deeper implant region for forming a punch-through stop being formed in a central portion of a channel in each of the plurality of active regions, and an intergate-dielectric layer being at least formed over the plurality of floating-gate structures and the plurality of first raised field-oxide layers, an elongated control-gate conductive layer acted as a word line being formed over said intergate-dielectric layer, and a planarized capping thick-oxide layer being formed over said elongated control-gate conductive layer; and a plurality of metal bit-lines integrated with the plurality of planarized common-drain conductive islands being simultaneously patterned to be aligned above the plurality of active regions.

20. The stack-gate flash memory array according to claim 19, wherein said common-drain diffusion region comprises a shallow heavily-doped diffusion region of said second conductivity type or a shallow heavily-doped diffusion region of said second conductivity type formed within a moderately-doped diffusion region of said first conductivity type.

* * * * *